United States Patent
Doong et al.

(10) Patent No.: US 10,410,735 B1
(45) Date of Patent: Sep. 10, 2019

(54) DIRECT ACCESS MEMORY CHARACTERIZATION VEHICLE

(71) Applicant: PDF Solutions, Inc., San Jose, CA (US)

(72) Inventors: Yih-Yuh Doong, Zhubei (TW); Chao-Hsiung Lin, Zhubei (TW); Sheng-Che Lin, BaoShan Township (TW); Shihpin Kuo, Tainan (TW); Tzupin Shen, Hsinchu (TW); Chia-Chi Lin, Hsinchu (TW); Kimon Michaels, Monte Sereno, CA (US)

(73) Assignee: PDF SOLUTIONS, INC., Santa Clara, CA (US)

( * ) Notice: Subject to any disclaimer, the term of this patent is extended or adjusted under 35 U.S.C. 154(b) by 0 days.

(21) Appl. No.: 15/441,016

(22) Filed: Feb. 23, 2017

(51) Int. Cl.
| | |
|---|---|
| *G11C 29/12* | (2006.01) |
| *G06F 1/3206* | (2019.01) |
| *G06F 13/28* | (2006.01) |
| *G11C 29/48* | (2006.01) |

(52) U.S. Cl.
CPC ............ *G11C 29/12* (2013.01); *G06F 1/3206* (2013.01); *G06F 13/28* (2013.01); *G11C 2029/1202* (2013.01); *G11C 2029/1204* (2013.01)

(58) Field of Classification Search
CPC ............ G11C 29/12; G11C 2029/1202; G11C 2029/1204; G06F 1/3206; G06F 13/28
See application file for complete search history.

(56) References Cited

U.S. PATENT DOCUMENTS

| | | | | |
|---|---|---|---|---|
| 6,581,200 | B2* | 6/2003 | Chopra ............... | G06F 17/5068 716/103 |
| 2005/0007120 | A1* | 1/2005 | Yamashita ......... | G01R 31/2884 324/519 |
| 2005/0093573 | A1* | 5/2005 | Madurawe .......... | G06F 17/5045 326/41 |
| 2005/0117408 | A1* | 6/2005 | Theel ...................... | G11C 11/16 365/189.09 |
| 2006/0039177 | A1* | 2/2006 | Fukada .................... | G11C 8/14 365/145 |
| 2006/0255477 | A1* | 11/2006 | Kim ......................... | H01L 22/32 257/786 |
| 2009/0262574 | A1* | 10/2009 | Hanzawa ......... | G01R 31/31715 365/163 |
| 2010/0165724 | A1* | 7/2010 | Pellizzer .................. | G11C 8/08 365/163 |

(Continued)

*Primary Examiner* — April Y Blair
*Assistant Examiner* — Dipakkumar B Gandhi
(74) *Attorney, Agent, or Firm* — Pillsbury Winthrop Shaw Pittman LLP (57) ABSTRACT

A memory-specific implementation of a test and characterization vehicle utilizes a design layout that is a modified version of the product mask. Specific routing is used to modify the product mask in order to facilitate memory cell characterization. This approach can be applied to any memory architecture with word-line and bit-line perpendicular or substantially perpendicular to each other, including but not limited to, volatile memories such as Static Random Access Memory (SRAM), Dynamic RAM (DRAM), non-volatile memory such as NAND Flash (including three-dimensional NAND Flash), NOR Flash, Phase-change RAM (PRAM), Ferroelectric RAM (FeRAM), Correlated electron RAM (CeRAM), Magnetic RAM (MRAM), Resistive RAM (RRAM), XPoint memory and the like.

20 Claims, 11 Drawing Sheets

(56) References Cited

U.S. PATENT DOCUMENTS

| | | | |
|---|---|---|---|
| 2011/0055776 A1* | 3/2011 | Kobayashi | G06F 17/5036 716/52 |
| 2011/0286271 A1* | 11/2011 | Chen | G11C 7/1006 365/185.09 |
| 2013/0155759 A1* | 6/2013 | Kao | G11C 11/14 365/158 |
| 2013/0226110 A1* | 8/2013 | Pugh | A61F 9/0017 604/294 |
| 2013/0346056 A1* | 12/2013 | Amirkhanyan | G06F 17/5045 703/14 |
| 2014/0042585 A1* | 2/2014 | Peng | G06F 17/5081 257/499 |
| 2015/0061709 A1* | 3/2015 | Ajuria | G01R 31/2884 324/750.3 |
| 2015/0092494 A1* | 4/2015 | Rhie | G11C 16/16 365/185.12 |
| 2016/0093033 A1* | 3/2016 | Allano | G06T 7/0073 382/165 |

* cited by examiner

FIG. 1

| PG(0,n-1) | ... | PG(m-2,n-1) | PG(m-1,n-1) |
|---|---|---|---|
| .... | ... | ... | ... |
| .... | ... | ... | ... |
| .... | ... | ... | ... |
| .... | ... | ... | ... |
| ... | PG(i, j) | ... | ... |
| .... | ... | ... | ... |
| .... | ... | ... | ... |
| .... | ... | ... | ... |
| PG(0,0) | .... | .... | PG(m-1, 0) |

DIRECT ACCESS MEMORY CHARACTERIZATION VEHICLE

BACKGROUND

Technical Field

The disclosure relates to designing and fabricating a test vehicle for specific volatile or non-volatile memory architectures.

Brief Description of the Prior Art

For memory device characterization, usually a dedicated test wafer is used, that requires a separate layout for fabricating the test structures, i.e. the layout is different from the real product layout. If test structures are built into the same wafer where the memory cells are in the real product, then to accommodate the difference between the test structures and the real product, the process flow becomes more complicated, and the process time becomes longer than usual. Also, though there are various test vehicles available for memory bit-cell characterization, most of the prior art are focused on full process flow combined with a bit-map centric debug. Existing bit-cell characterization processes only give pass/fail results without the detection of specific failure mode.

SUMMARY

A method for designing a test vehicle is described that can work for various memory cells architectures, while introducing minimal disruption in the process flow for decoding, and preferably utilizing the same layout that is used to fabricate the memory cells in the real product.

In one aspect, a memory-specific implementation of a test and characterization vehicle is disclosed, utilizing a design layout that is a modified version of the product mask. Specific routing is used to modify the product mask in order to facilitate memory cell characterization. This approach can be applied to any memory architecture with word-line and bit-line perpendicular or substantially perpendicular to each other, including but not limited to, volatile memories such as Static Random Access Memory (SRAM), Dynamic RAM (DRAM), non-volatile memory such as NAND Flash (including three-dimensional NAND Flash), NOR Flash, Phase-change RAM (PRAM), Ferroelectric RAM (FeRAM), Correlated electron RAM (CeRAM), Magnetic RAM (MRAM), Resistive RAM (RRAM), XPoint memory and the like.

Specifically, the disclosure describes a method for designing a test vehicle utilizing a layout of a memory array comprising a plurality of memory bit-cells connected by routing interconnects, a plurality of bit-lines, and a plurality of word-lines, the method comprising: importing a full-chip layout of the memory array; partitioning the full-chip layout into a plurality of probe groups, each probe group comprising a plurality of probe pads, and, an area of interest (AOI) having at least some of the plurality of memory bit-cells connected by the routing interconnect; selecting a set of memory bit-cells within the AOI; removing the previous routing interconnect for the selected set of memory bit-cells; creating customized interconnect layers (CIL) to reconfigure connection between the selected set of memory bit-cells; and, incorporating the selected set of memory bit-cells with the CIL into the full-chip layout to create a modified full-chip layout such that a wafer fabricated using the modified full-chip layout comprises a memory array with a built-in test vehicle.

The advantages of this approach includes, but are not limited to, compatibility to short process flow, ability to skip additional process flow for decoding, ability to perform current-voltage (I-V) measurement in addition to indicating pass/fail results, ability to pinpoint failure site location, and detection of specific failure mode.

BRIEF DESCRIPTION OF THE DRAWINGS

The above aspects and other aspects and features will become apparent to those ordinarily skilled in the art upon review of the following description of specific embodiments in conjunction with the accompanying figures, wherein.

DETAILED DESCRIPTION OF THE EMBODIMENTS

Embodiments of the present disclosure will now be described in detail with reference to the drawings, which are provided as illustrative examples so as to enable those skilled in the art to practice the embodiments. Notably, the figures and examples below are not meant to limit the scope to a single embodiment, but other embodiments are possible by way of interchange of some or all of the described or illustrated elements. Where certain elements of these embodiments can be partially or fully implemented using known components, only those portions of such known components that are necessary for an understanding of the embodiments will be described, and detailed descriptions of other portions of such known components will be omitted so as not to obscure the description of the embodiments. In the present specification, an embodiment showing a singular component should not be considered limiting; rather, the scope is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the scope encompasses present and future known equivalents to the components referred to herein by way of illustration.

A test vehicle comprises multiple product layers which are used to build transistors (except original interconnect layers that are removed) and one or more Customized Interconnect Layers (CILs), which can be used to select one of (a) select memory-bit-cells-under-test (MUTs). The memory bit-cells within the product can be connected to probe pads for current-voltage (I-V) or special failure mode characterization by CILs. With the aid of direct access approach, bit-line probe pads can be shared within one memory array and word-line/substrate probe pads can be shared across transistor arrays. The bit-line conducts current during I-V measurement and word-line only conducts voltage. The Probe Group (PG) comprises of probe pads, routing interconnect and Area-Of-Interest (AOI), where any of transistors located in AOI can be selected as MUTs. The PGs are evenly placed across product chip. Thus, memory bit-cells within AOI across a full product can be connected through CILs for testing.

Figure 1:
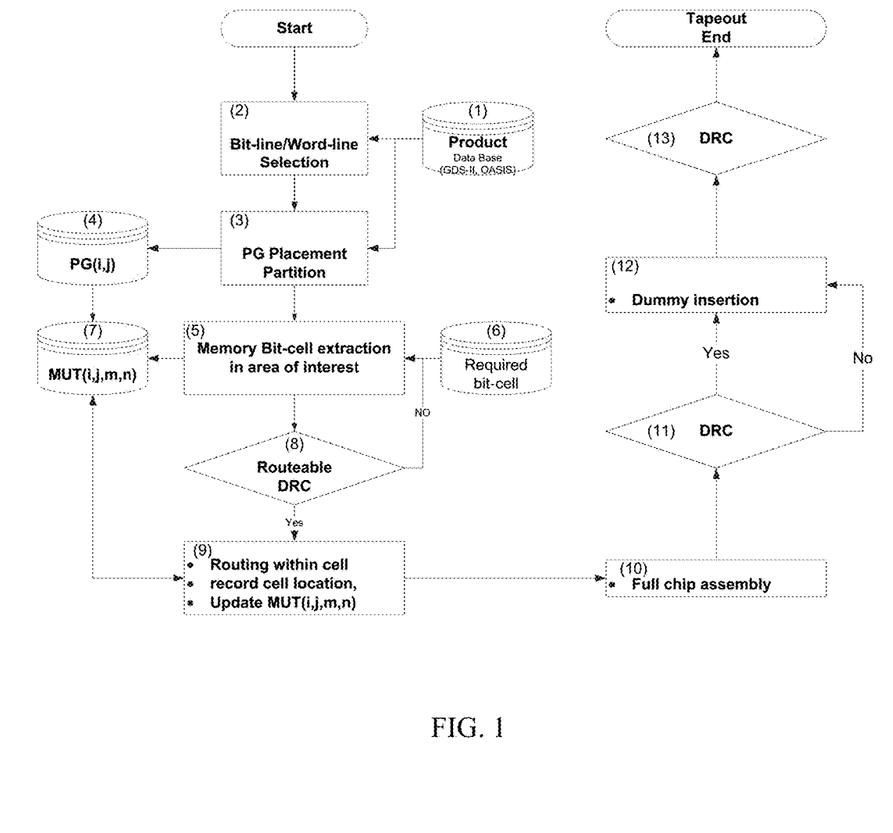
FIG. 1 illustrates a design flow of direct access memory characterization vehicle (DAM-CV) for memory-bit-cell-under-test (MUT) and its application to improve process and yield.

FIG. 1 shows an exemplary process flow for the design of the direct access memory characterization (DAM-CV) vehicle design, according to an embodiment of the present disclosure. DAM-CV design starts from importing the product chip design layout into database such as OpenAccess (e.g., OASIS) or GDS-II, as shown in step (1). Next, the bit-cell and word-line connection locations within the product layout are located, and routing direction is decided accordingly, as shown in step (2).

Figure 2:
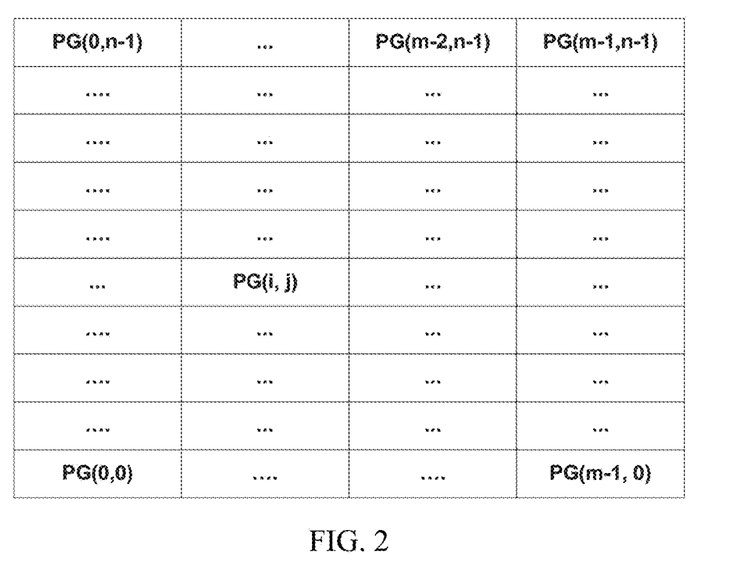
FIG. 2 illustrates floor plan of a probe group.
Figure 3A:
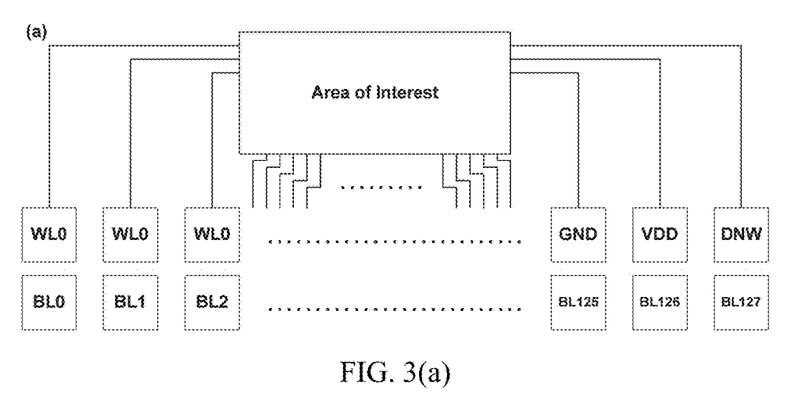
FIG. 3(a) illustrates floor plan of probe pads, routing channels and areas of interest for a single layer routing approach.
Figure 3B:
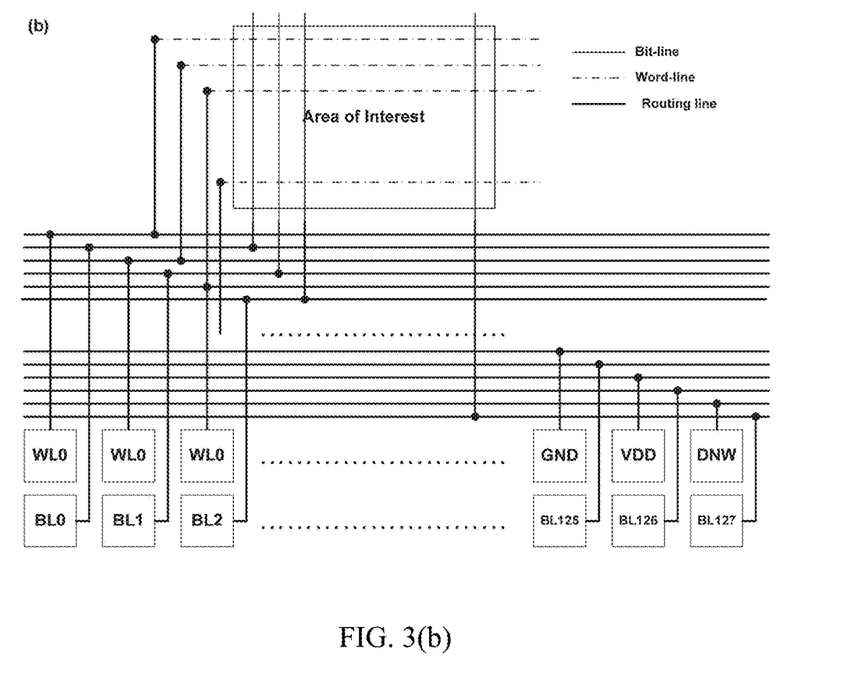
FIG. 3(b) illustrates floor plan of probe pads, routing channels and areas of interest for a double layer routing approach.

Full chip floor plan is obtained and partitioned in step (3). By measuring chip size at X- and Y-direction, the full chip is evenly partitioned into rectangular areas called probe groups (PGs), as shown in FIG. 2. Each PG(i,j), comprises probe pads for bit-lines ($BL_m$), word-line($WL_m$), and Substrate (either DNW, NW or GND), vertical routing area, horizontal routing area and area of interest for MUTs. DNW indicates probe pads from deep NWell. NW indicates probe pads for NWell. GND indicates probe pads for ground. A detail routing of probe group is shown in FIG. 3. FIG. 3(a) is an example of single layer routing approach and FIG. 3(b) is an example of two-layers routing approach. In the example shown in FIG. 3, there are 128 bit-line probe pads, i.e. the index m of BL varies from 0-127.

To maximize MUT counts within the area of interest, the optimization process used is described below. Assumption is that for N number of total probe pads, where 3 pads are already assigned for DNW, NW, and Ground (GND), we have to find the number of word-line pads (WL) and bit-line pads (BL).

Mathematically, the condition is: WL+BL+3≤N
MUT counts are equal to WL×BL $$WL \times BL = -\left(WL^2 - 2 \times \frac{N-3}{2} \times WL + \left(\frac{N-3}{2}\right)^2\right) + \left(\frac{N-3}{2}\right)^2 =$$

$$-\left(WL - \frac{N-3}{2}\right)^2 + \left(\frac{N-3}{2}\right)^2 \le \left(\frac{N-3}{2}\right)^2$$

In the above example, we choose N=256, WL=126, BL=127 and MUTs=126*127=16002.

Target MUTs are selected from either the result of pattern extraction, as shown in step (5) of FIG. 1, or selected from bit-cells at predefined location (such as corner or edge), as shown in step (6). MUTs in each of PG(i, j) will stored in MUT(i, j, m, n), as shown in step (7). MUT (i, j, m, n) is a matrix. Instead of MUT (i, j, m, n), it could also be TX(i,j,m,n), where TX indicates a transistor instead of the entire memory cell MUT.

Routability check and design rule check (DRC) are performed in step (8). The result is updated to step (7) or will ask extraction procedure in step (4) to provide a new MUT. The closed loop between step (4) and step (7) will end at the condition that it find MUT is routable and DRC is clean, or there is no MUT available in that slot. The later will flag MUT (i, j, m, n) as empty cell.

A routing procedure in step (8) will take information from MUT (i, j, m, n) and perform interconnect routing to connect Drain/Source/Gate to probe pads. The matrix MUT (i, j, m, n) is the matrix to store a flag. The flag will tell whether MUT (i, j, m, n) can be routed or not. After routing is complete, we can check MUT matrix to know how many MUTs are connected and how many are not connected.

A full chip assembly procedure in step (9) will take result from step (8) and place all MUTs into PG and assembly all PGs into full chip.

DRC is performed again in step (10). This procedure will discover violations in full chip density and the boundary among PGs.

Dummy insertion is taken in step (11) to fulfill manufacturing requirement such as multiple mask density balancing, CMP planarization etc.

Optionally, DRC is performed again in step (12). This procedure will discover violations in full chip post dummy insertion and multiple masks balancing.

Voltage setting for all pins as listed in Table 1. Block leakage can be measured by turning off all gates. Block leakage can be measured by turning off all devices within and AOI. Within blocks, MUT is tested in sequence. Across block and PGs, testing can be performed in parallel.

Table 1 summarizes the calculation of optimum number of memory cell counts to implement the characterization vehicle of the present disclosure. In particular, Table I lists the optimal condition of pin assignment to maximize accessible MUT counts per memory block for the various memory types. The memory types include SRAM array (FIG. 4(c)), DRAM array (FIG. 5), NAND Flash array (FIG. 6), NOR Flash array (FIG. 7), RRAM array (FIG. 8), and X-pint array (FIG. 9). Note that the RRAM array configuration of FIG. 8 is applicable for any memory with one resistor and one transistor per cell, such as FeRAM, CeRAM, MRAM etc. Essentially any memory architecture where word lines and bit-lines are substantially perpendicular can utilize the test vehicle of the current disclosure.

TABLE 1

Summary of the various types of memory design

Figure 4A:
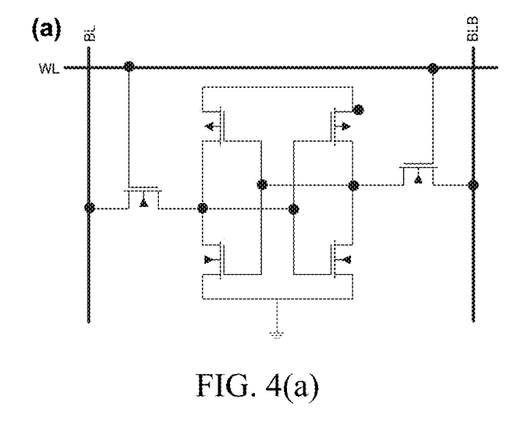
FIG. 4(a) illustrates schematic of SRAM bit-cell.
Figure 4B:
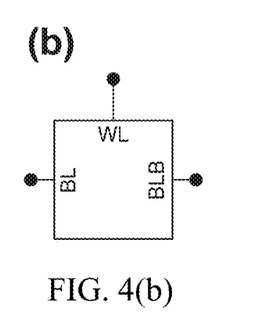
FIG. 4(b) illustrates an SRAM bit-cell symbol; and, FIG. 4(c) illustrates schematic of an SRAM array using the SRAM bit-cell symbol.
Figure 4C:
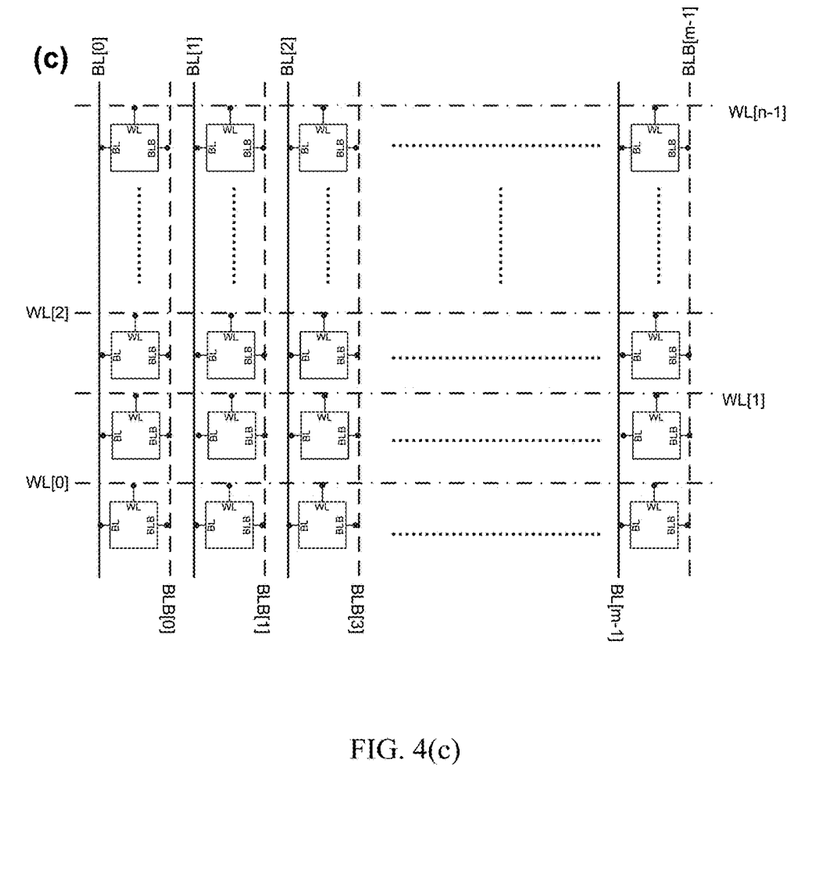

| Schematic | VDD GND DNW | # of Bit-Line | # of Word-line | Maximum Cell counts | Constraints |
|---|---|---|---|---|---|
| SRAM FIG. 4 | VDD GND | BL | WL | WL + BL + 2 ≤ N<br>WL×BL<br>$= -\left(WL^2 - 2 \times \frac{N-2}{2} \times WL + \left(\frac{N-2}{2}\right)^2\right) + \left(\frac{N-2}{2}\right)^2$<br>$= -\left(WL - \frac{N-2}{2}\right)^2 + \left(\frac{N-2}{2}\right)^2 \le \left(\frac{N-2}{2}\right)^2$ | $\frac{(N-2)}{2}$ is integer |

TABLE 1-continued

Summary of the various types of memory design

Figure 5:
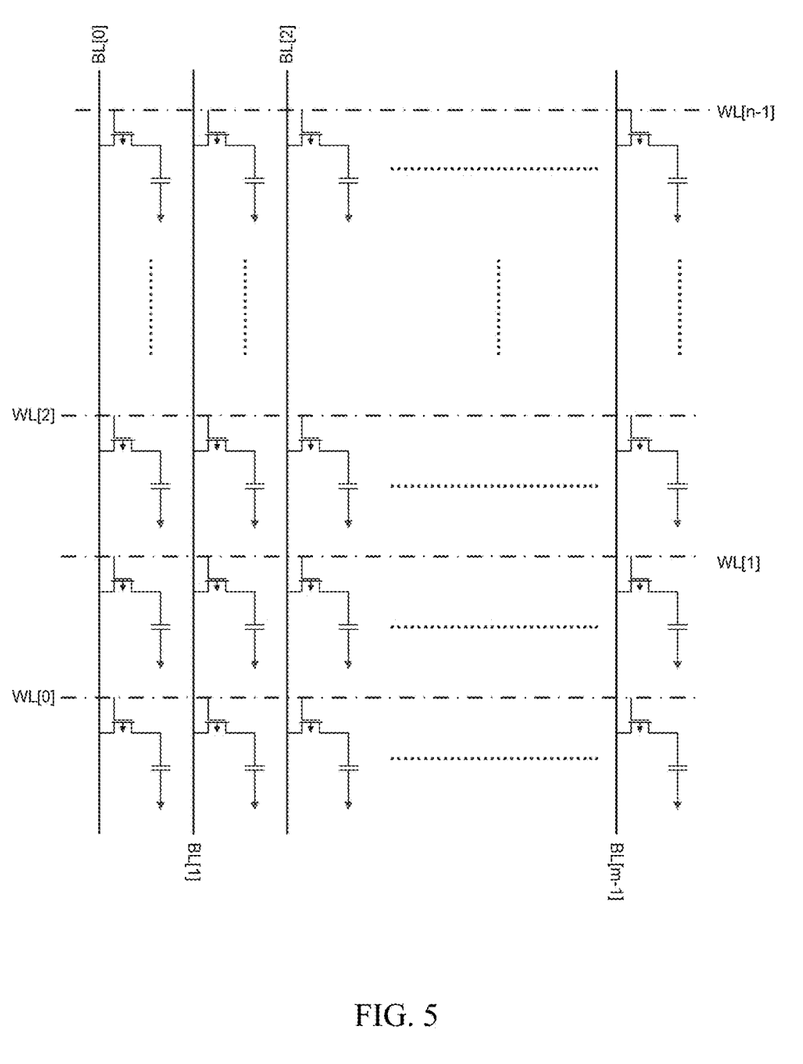
FIG. 5 illustrates schematic of a DRAM array.
Figure 6:
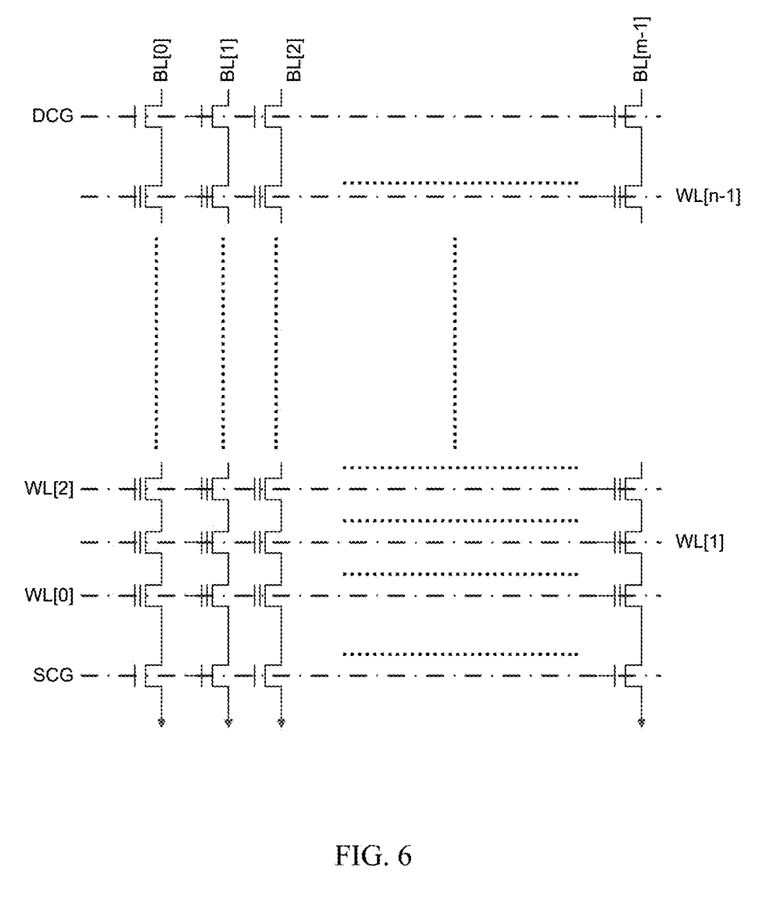
FIG. 6 illustrates schematic of a NAND array.
Figure 7:
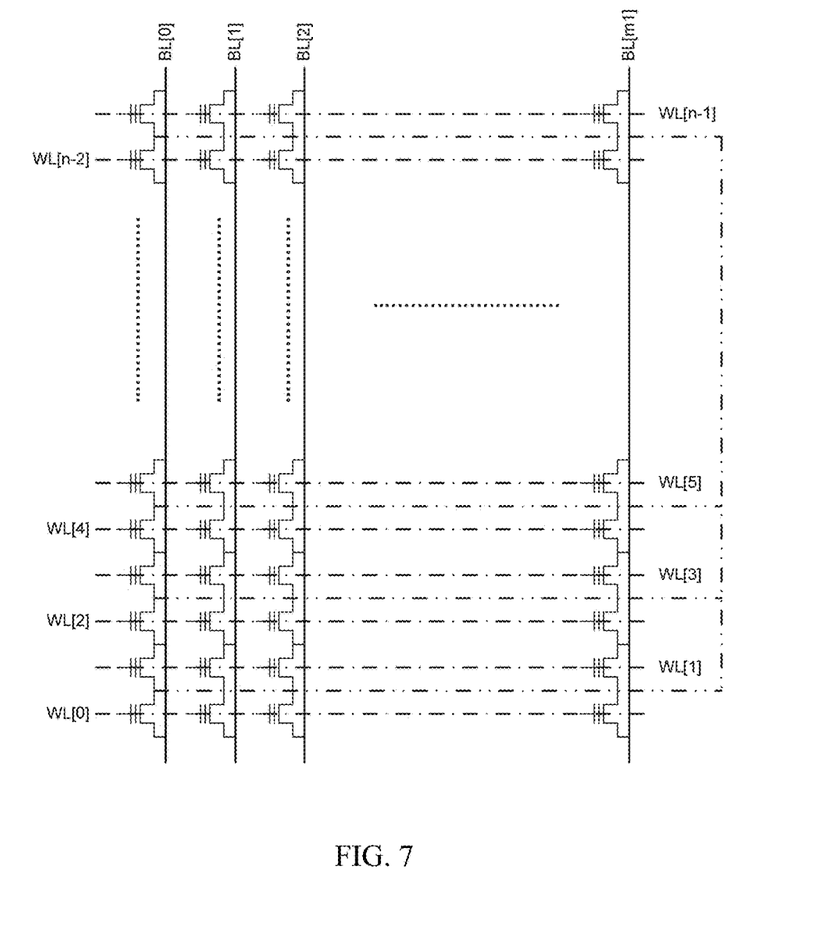
FIG. 7 illustrates schematic of a NOR array.
Figure 8:
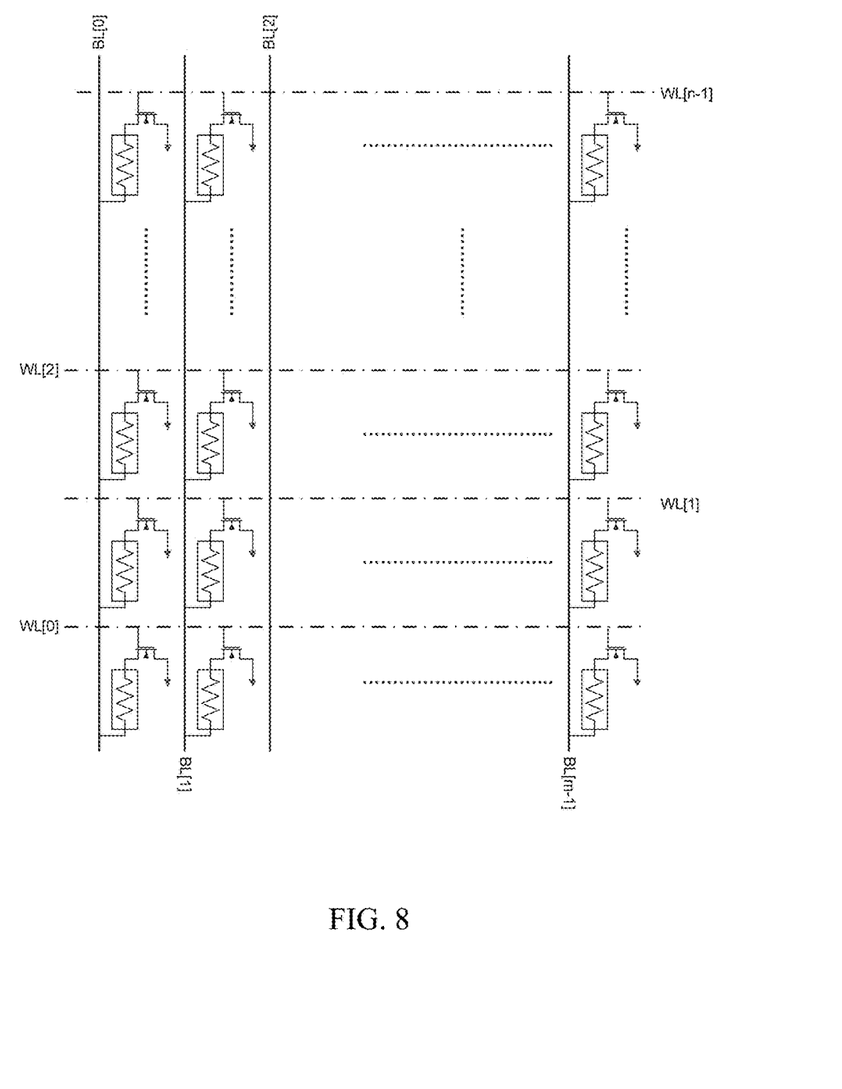
FIG. 8 illustrates schematic of an RRAM array that can be applied to any memory configuration with a resistor and a transistor per cell, such as FeRAM, CeRAM, MRAM etc.
Figure 9:
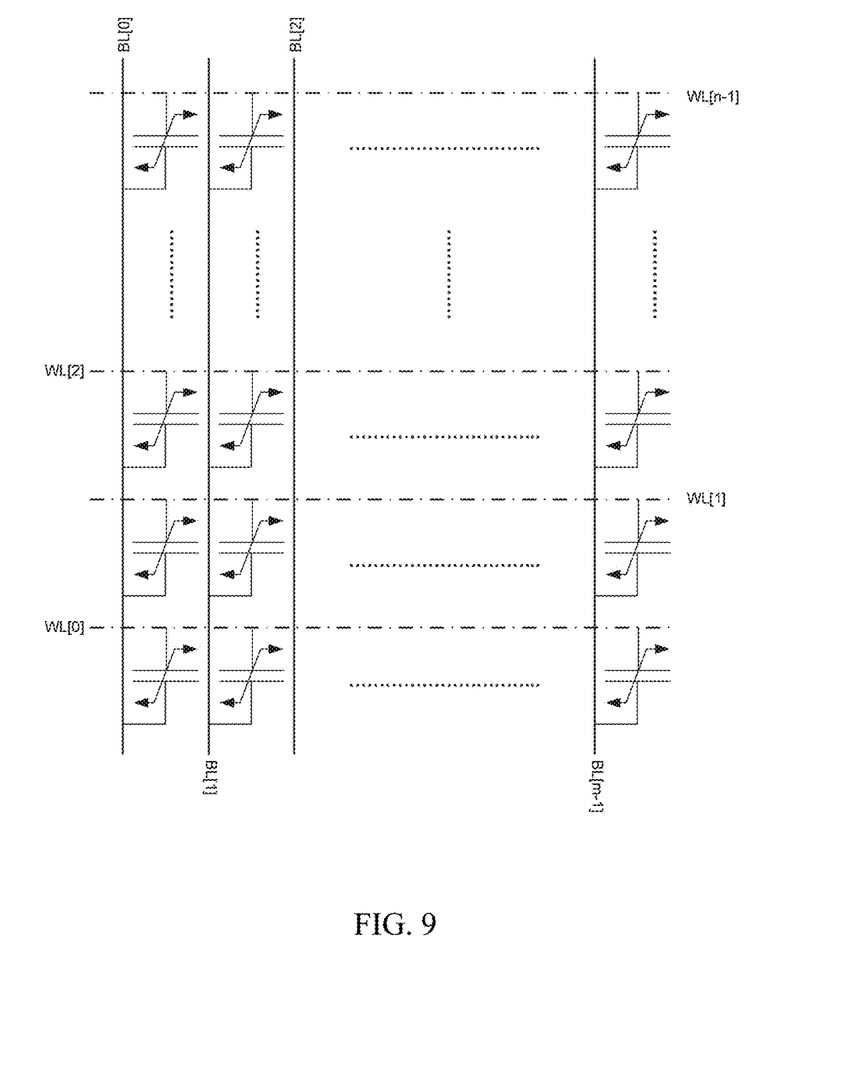
FIG. 9 illustrates schematic of an X-point array.

| Schematic | VDD GND DNW | # of Bit-Line | # of Word-line | Maximum Cell counts | Constraints |
|---|---|---|---|---|---|
| DRAM FIG. 5 | VDD GNC DNW | BL | WL | $WL + BL + 3 \le N$<br>$WL \times BL$<br>$= -\left(WL^2 - 2 \times \frac{N-3}{2} \times WL + \left(\frac{N-3}{2}\right)^2\right) + \left(\frac{N-3}{2}\right)^2$<br>$= -\left(WL - \frac{N-3}{2}\right)^2 + \left(\frac{N-3}{2}\right)^2 \le \left(\frac{N-3}{2}\right)^2$ | $\frac{(N-3)}{2}$ is integer |
| NAND FIG. 6 | VDD GND DWN | BL | $(32+2) * WL$ | $34 \times WL + BL + 3 \le N$<br>$WL \times BL$<br>$= -34 \times \left(WL^2 - 2 \times \frac{N-3}{68} \times WL + \left(\frac{N-3}{68}\right)^2\right) + 34 \times \left(\frac{N-3}{68}\right)^2$<br>$= -34 \times \left(WL - \frac{N-3}{68}\right)^2 + 34 \times \left(\frac{N-3}{68}\right)^2 \le 34 \times \left(\frac{N-3}{68}\right)^2$ | |
| | VDD GND DWN | BL | $(64+2) * WL$ | $66 \times WL + BL + 3 \le N$<br>$WL \times BL$<br>$= -66 \times \left(WL^2 - 2 \times \frac{N-3}{132} \times WL + \left(\frac{N-3}{132}\right)^2\right) + 66 \times \left(\frac{N-3}{132}\right)^2$<br>$= -66 \times \left(WL - \frac{N-3}{132}\right)^2 + 66 \times \left(\frac{N-3}{132}\right)^2 \le 66 \times \left(\frac{N-3}{132}\right)^2$ | |
| NOR FIG. 7 | VDD GND Source | BL | WL | $WL + BL + 3 \le N$<br>$WL \times BL$<br>$= -\left(WL^2 - 2 \times \frac{N-3}{2} \times WL + \left(\frac{N-3}{2}\right)^2\right) + \left(\frac{N-3}{2}\right)^2$<br>$= -\left(WL - \frac{N-3}{2}\right)^2 + \left(\frac{N-3}{2}\right)^2 \le \left(\frac{N-3}{2}\right)^2$ | $\frac{(N-3)}{2}$ is integer |
| RRAM FIG. 8 | VDD GND | BL | WL | $WL + BL + 2 \le N$<br>$WL \times BL$<br>$= -\left(WL^2 - 2 \times \frac{N-2}{2} \times WL + \left(\frac{N-2}{2}\right)^2\right) + \left(\frac{N-2}{2}\right)^2$<br>$= -\left(WL - \frac{N-2}{2}\right)^2 + \left(\frac{N-2}{2}\right)^2 \le \left(\frac{N-2}{2}\right)^2$ | $\frac{(N-2)}{2}$ is integer |
| Xpoint RAM FIG. 9 | 0 | BL | WL | $WL + BL \le N$<br>$WL \times BL$<br>$= -\left(WL^2 - 2 \times \frac{N}{2} \times WL + \left(\frac{N}{2}\right)^2\right) + \left(\frac{N}{2}\right)^2$<br>$= -\left(WL - \frac{N}{2}\right)^2 + \left(\frac{N}{2}\right)^2 \le \left(\frac{N}{2}\right)^2$ | $\frac{N}{2}$ is integer |

Figure 10:
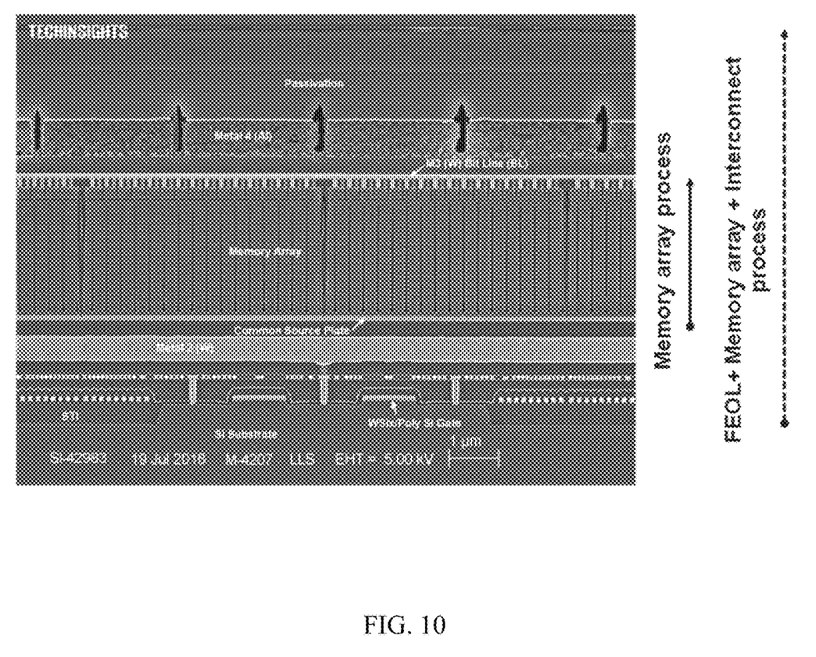
FIG. 10 illustrates a cross-section of a scanning electron micrograph (SEM) taken from a Micron 3D Flash memory.

This test vehicle, as described, allows for a wafer that includes chips containing memory cells that will become the actual product. Specifically, the wafer that can be used may only contain the front-end-of-the-line (FEOL) layers necessary to produce the transistors, resistors and capacitors that will become the actual product, which include the active, gate, ion implantation and stress layers. FIG. 10 shows a cross-section of SEM micrograph taken from Micron 3D Flash memory, showing how the characterization process can be integrated into the regulat memory array process for integration with the FEOL and the interconnects. As such, the wafer that is used for testing need not contain the metal layers for routings that will be implemented to make interconnections therebetween for the actual product. Rather, as described, with only necessary layers as described above being disposed on the test wafer, the CILs are fabricated over such layers, thereby allowing for the direct testing of the various transistors, resistors and capacitors the full product. As a result, it is possible to take the real product design and turn it into memory-cell test chip (array). Since the memory cells are inside real product environment, other than the CIL for routing, all behaviors/issues in memory cells can be tested as they behave in the real product design.

This disclosure in general relates to hardware and/or software-based methods of product characterization, new testing techniques (e.g., improvements to tester efficacy or throughput), and, use of a known test structure for a novel purpose, such as implementation of software for design of experiments (DOEs), including choosing structures for filler cells for novel production control purposes. The disclosure directly impacts e-metrology and production control. By using this disclosure, technology development can be performed at memory array process to save cycle time.

The disclosure has been described in terms of particular embodiments. Other embodiments are within the scope of the following claims. For example, the steps of the disclosure can be performed in a different order and still achieve desirable results. While certain representative embodiments and details have been shown for purposes of illustrating the disclosure, it will be apparent to those skilled in the art that various changes in the methods and apparatus disclosed herein may be made without departing from the scope of the disclosure which is defined in the appended claims.

The invention claimed is:

1. A method for designing a test vehicle utilizing a layout of a memory array comprising a plurality of memory bit-cells connected by routing interconnects, a plurality of bit-lines, and a plurality of word-lines, the method comprising:
   importing a full-chip layout of the memory array;
   partitioning the full-chip layout into a plurality of probe groups, each probe group comprising a plurality of probe pads, and an area of interest (AOI) having at least some of the plurality of memory bit-cells connected by the routing interconnect;
   selecting a set of memory bit-cells within the AOI;
   removing the previous routing interconnect for the selected set of memory bit-cells;
   creating customized interconnect layers (CIL) to reconfigure connection between the selected set of memory bit-cells; and
   incorporating the selected set of memory bit-cells with the CIL into the full-chip layout to create a modified full-chip layout such that a wafer fabricated using the modified full-chip layout comprises a memory array with a built-in test vehicle,
   wherein the plurality of probe pads comprise bit-line probe pads corresponding to the plurality of bit-lines and word-line probe pads corresponding to the plurality of word-lines, and wherein a number of bit-line probe pads and word-line probe pads that provide a maximum accessible bit count within the memory array is calculated using physical constraints converted to mathematical constraints.

2. The method of claim 1, wherein the memory array comprises volatile memory array comprising SRAM or DRAM.

3. The method of claim 1, wherein the memory array comprises a non-volatile memory array comprising one of: NAND Flash, NOR Flash, MRAM, RRAM, PRAM, FeRAM, CeRAM, and X-point.

4. The method of claim 1, wherein the probe groups are spatially evenly distributed across the layout of the memory array.

5. The method of claim 1, wherein the bit-lines and the word-lines are substantially perpendicular to each another.

6. The method of claim 1, wherein at least three probe pads within each probe group are assigned to deep N-well, n-well and ground respectively.

7. The method of claim 1, wherein the bit-line probe pads are shared within the memory array.

8. The method of claim 7, wherein the bit-lines conduct current during current-voltage (I-V) measurement.

9. The method of claim 7, wherein the word-line probe pads are shared across transistor arrays.

10. The method of claim 9, wherein the word-lines conduct voltage during current-voltage (I-V) measurement.

11. The method of claim 1, wherein the modified full-chip layout complies with a Design Rule Check (DRC) process.

12. The method of claim 11, wherein DRC substantially maintains a uniform full chip density across the modified full-chip layout including detecting violations at probe group boundaries.

13. The method of claim 12, wherein a dummy insertion process is performed before tapeout to comply with manufacturing requirement.

14. The method of claim 1, wherein the step of selecting the set of memory bit-cells comprises using a pattern extraction method.

15. The method of claim 1, wherein the step of selecting the set of memory bit-cells comprises using a predefined location within the AOI.

16. The method of claim 15, wherein the predefined location includes one or more of an edge of a bit-cell, a corner of a bit-cell.

17. A method comprising: importing product mask information for an existing layout design of an integrated circuit chip containing a memory array; and converting the existing layout design of the integrated circuit chip containing the memory array into a modified test chip version of the layout design with a test circuit built into the existing layout design for the integrated circuit chip, including: partitioning the existing layout design into a plurality of probe groups across the integrated circuit chip, wherein each probe group at least comprises (1) a plurality of memory bitcells in an area of interest within the probe group, (2) a plurality of probe pads, and (3) routing interconnecting the plurality of memory bitcells in the area of interest with one or more of the plurality of probe pads; removing routing in the area of interest from the existing layout design of the integrated circuit chip that previously interconnected the plurality of memory bitcells; generating customized interconnect layers to replace the routing of the existing layout design removed from the area of interest, the customized interconnect layers connecting the plurality of memory bitcells with one or more of the plurality of probe pads in the area of interest; and integrating the plurality of memory bitcells and the customized interconnect layers into the existing layout design for the integrated circuit chip to generate the modified version of the layout design comprising a memory array with the built-in test circuit, wherein the plurality of probe pads comprise bit-line probe pads corresponding to a plurality of bit-lines and word-line probe pads corresponding to a plurality of word-lines, and wherein a number of bit-line probe pads and word-line probe pads that provide a maximum accessible bit count within the memory array is calculated using physical constraints converted to mathematical constraints.

18. The method of claim 17 wherein the customized interconnect layers are connected with the plurality of probe pads in the area of interest for current or voltage measurements.

19. The method of claim 17 wherein the customized interconnect layers are connected with the plurality of probe pads in the area of interest for special failure mode characterization.

20. The method of claim 17 wherein the probe groups comprise:
   probe pads for bit lines and word lines;
   probe pads for the substrate of the integrated circuit; and
   vertical and horizontal routing for the plurality of memory bitcells in the area of interest.

* * * * *